United States Patent
Lee (10) Patent No.: US 10,152,372 B2
(45) Date of Patent: Dec. 11, 2018

(54) DATA STORAGE DEVICE AND OPERATING METHOD THEREOF

(71) Applicant: SK hynix Inc., Gyeonggi-do (KR)

(72) Inventor: Hyung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 161 days.

(21) Appl. No.: 15/153,334

(22) Filed: May 12, 2016

(65) Prior Publication Data
US 2017/0199783 A1    Jul. 13, 2017

(30) Foreign Application Priority Data

Jan. 8, 2016  (KR) .................. 10-2016-0002782

(51) Int. Cl.
| | |
|---|---|
| G06F 11/00 | (2006.01) |
| G06F 11/10 | (2006.01) |
| G11C 29/52 | (2006.01) |
| G11C 29/50 | (2006.01) |
| G11C 16/34 | (2006.01) |

(52) U.S. Cl.
CPC ...... G06F 11/1064 (2013.01); G06F 11/1048 (2013.01); G11C 29/52 (2013.01); G11C 16/34 (2013.01); G11C 29/50004 (2013.01)

(58) Field of Classification Search
CPC ... G11C 29/52; G11C 29/50004; G11C 16/34; G11C 16/3404; G06F 11/1064
USPC .............. 714/718, 719, 721, 763, 766
See application file for complete search history.

(56) References Cited

U.S. PATENT DOCUMENTS

| | | | | |
|---|---|---|---|---|
| 2008/0062758 A1* | 3/2008 | Honma | ............... | G11C 11/5642 365/184 |
| 2010/0034018 A1* | 2/2010 | Yang | ................... | G11C 11/5642 365/185.2 |
| 2011/0205805 A1* | 8/2011 | Honma | ............... | G11C 11/5628 365/185.22 |
| 2012/0140560 A1* | 6/2012 | Yang | ...................... | G06F 3/064 365/185.18 |
| 2013/0155776 A1* | 6/2013 | Chilappagari | ......... | G11C 16/34 365/185.24 |
| 2013/0215678 A1 | 8/2013 | Yang | | |
| 2014/0050024 A1* | 2/2014 | Shirota | .................. | G11C 16/26 365/185.03 |
| 2015/0228332 A1* | 8/2015 | Yang | ................... | G11C 11/5628 365/185.03 |
| 2015/0293813 A1* | 10/2015 | Lin | ..................... | G06F 11/1012 714/764 |
| 2016/0011807 A1* | 1/2016 | Seol | .................... | G11C 11/5628 711/102 |

(Continued)

FOREIGN PATENT DOCUMENTS

KR     1020130055583     5/2013

*Primary Examiner* — Albert Decady
*Assistant Examiner* — Osman M Alshack
(74) *Attorney, Agent, or Firm* — IP & T Group LLP (57) ABSTRACT

A method for operating a data storage device includes reading a plurality of data chunks from a plurality of pages corresponding to target memory cells coupled to a target word line based on read biases; obtaining discrimination data corresponding to the target memory cells based on discrimination biases; determining an unreliable bit in a target data chunk among the plurality of data chunks based on the plurality of data chunks and the discrimination data; and determining whether the unreliable bit is an error bit.

16 Claims, 10 Drawing Sheets

(56) References Cited

U.S. PATENT DOCUMENTS

2016/0011970 A1\* 1/2016 Sakurada ............ G11C 11/5628
                                                                              711/103
2017/0125128 A1\* 5/2017 Lee .................... G11C 29/1201

\* cited by examiner

| DCK1 | B11 | B12 | B13 | B14 | ... |

| DCK2 | B21 | B22 | B23 | B24 | ... |

| DCK3 | B31 | B32 | B33 | B34 | ... |

| PD | P1 | P2 | P3 | P4 | ... |

Grouped

Error correction operation for DCK1

$B11 = B21 \oplus B31 \oplus P1$
Flipped ← $\overline{B12} \neq B22 \oplus B32 \oplus P2$
Flipped ← $B13 \neq \overline{B23} \oplus B33 \oplus P3$
$B14 = B24 \oplus B34 \oplus P4$ ⎯ : Error bit

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0002782, filed on Jan. 8, 2016, which is incorporated herein by reference in its entirety.

BACKGROUND

1. Technical Field

Various embodiments generally relate to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

SUMMARY

In an embodiment, a method for operating a data storage device may include: reading a plurality of data chunks from a plurality of pages corresponding to target memory cells coupled to a target word line, based on read biases; obtaining discrimination data corresponding to the target memory cells, based on discrimination biases; determining an unreliable bit in a target data chunk among the plurality of data chunks, based on the plurality of data chunks and the discrimination data; and determining whether the unreliable bit is an error bit.

In an embodiment, a method for operating a data storage device may include: reading data including multiple bits from a target memory cell among a plurality of memory cells; determining an unreliable bit among the multiple bits; and determining whether the unreliable bit is an error bit.

In an embodiment, a data storage device may include: a nonvolatile memory device including target memory cells which are coupled to a target word line and correspond to a plurality of pages; and a controller suitable for reading the plurality of data chunks from a plurality of pages based on read biases, obtaining discrimination data corresponding to the target memory cells based on discrimination biases, determining an unreliable bit in a target data chunk among the plurality of data chunks based on the plurality of data chunks and the discrimination data, and determining whether the unreliable bit is an error bit.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
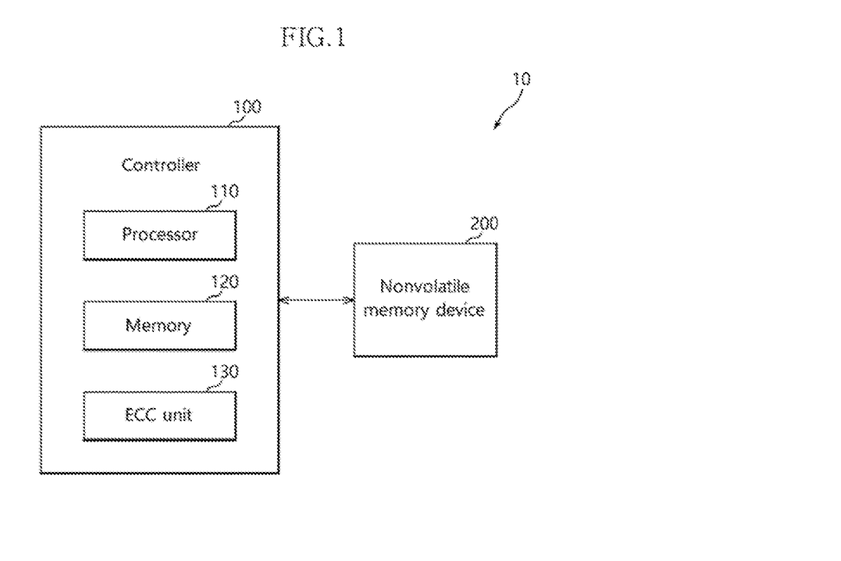
FIG. 1 is a block diagram illustrating a data storage device in accordance with an embodiment.

FIG. 1 is a block diagram illustrating a data storage device 10 in accordance with an embodiment.

The data storage device 10 may be configured to store data provided from an external device (not shown), in response to a write request from the external device. Also, the data storage device 10 may be configured to provide stored data to the external device, in response to a read request from the external device.

The data storage device 10 may be configured by a Personal Computer Memory Card International Association (PCMCIA) card, a compact flash (CF) card, a smart media card, a memory stick, a multimedia card (MMC), an embedded MMC (eMMC), a reduced-size multimedia card (RS-MMC) and a micro-size version of MMC (MMC-micro), a secure digital (SD) card, a mini secure digital (mini-SD) and a micro secure digital (micro-SD), a universal flash storage (UFS), or a solid state drive (SSD).

The data storage device 10 may include a controller 100 and a nonvolatile memory device 200.

The controller 100 may include a processor 110, a memory 120, and an error correction code (ECC) unit 130.

The processor 110 may control general operations of the data storage device 10. The processor 110 may store data in the nonvolatile memory device 200 in response to a write request transmitted from the external device, and may read data stored in the nonvolatile memory device 200 and output the read data to the external device in response to a read request transmitted from the external device.

The processor 110 may read a target data chunk from target memory cells which are coupled to a target word line of the nonvolatile memory device 200, and may perform a pattern-based error correction operation for the target data chunk. According to an embodiment, when an error correction operation for the target data chunk, according to the ECC algorithm of the ECC unit 130, fails, the processor 110 may perform the pattern-based error correction operation for the target data chunk.

In detail, when performing the pattern-based error correction operation, the processor 110 may read a plurality of data chunks from a plurality of pages corresponding to target memory cells, based on read biases, may obtain discrimination data corresponding to the target memory cells, based on discrimination biases, and may determine an unreliable bit in a target data chunk, based on the plurality of data chunks and the discrimination data.

The read biases and the discrimination biases delimit areas of threshold voltage of memory cells, and the unreliable bit may be one which is read from a target memory cell corresponding to an unreliable area among the areas of the threshold voltage. The unreliable area may include a predetermined range with respect to a read bias which is used to read the target data chunk. When the areas of the threshold voltage correspond to predetermined data patterns, the unreliable bit may be a bit in a data pattern corresponding to a plurality of bits read from the target memory cell, which does not match a bit in an adjacent data pattern.

The processor 110 may determine whether the unreliable bit determined according to the above-described method is an error bit. The unreliable bit determined according to the above-described method may have a high probability to be an error bit, and accordingly, the processor 110 may finally determine whether the unreliable bit is an error bit. In detail, the processor 110 may obtain data chunks grouped together with the target data chunk and parity data, and may determine whether the unreliable bit is an error bit, based on the grouped data chunks and the parity data. Grouped data chunks may mean data chunks which correspond to common parity data.

One or more of grouped data chunks may be included in data chunks read from pages corresponding to target memory cells. In this case, the processor 110 may obtain and use grouped data chunks from data chunks already read from the pages corresponding to the target memory cells, to determine an unreliable bit.

The memory 120 may serve as a working memory, a buffer memory or a cache memory of the processor 110. The memory 120 as a working memory may store software programs and various program data to be driven by the processor 110. The memory 120 as a buffer memory may buffer data transmitted between the external device and a storage medium such as, the nonvolatile memory device 200. The memory 120 as a cache memory may temporarily store cache data.

The ECC unit 130 may perform the error correction operation according to the ECC algorithm, by encoding data to be stored in the nonvolatile memory device 200 and decoding data read from the nonvolatile memory device 200.

The nonvolatile memory device 200 may store data transmitted from the controller 100 and may read stored data and transmit read data to the controller 100, according to control of the controller 100. The nonvolatile memory device 200 may read a plurality of data chunks from a plurality of pages corresponding to target memory cells, based on read biases, and transmit the plurality of data chunks to the controller 100, according to control of the controller 100. The nonvolatile memory device 200 may obtain discrimination data corresponding to the target memory cells, based on discrimination biases, and transmit the discrimination data to the controller 100, according to control of the controller 100.

The nonvolatile memory device 200 may include flash memory devices such as NAND flash or NOR flash, Ferro-electrics Random Access Memory (FeRAM), Phase-Change Random Access Memory (PCRAM), Magnetoresistive Random Access Memory (MRAM) or Resistive Random Access Memory (ReRAM).

Figure 2:
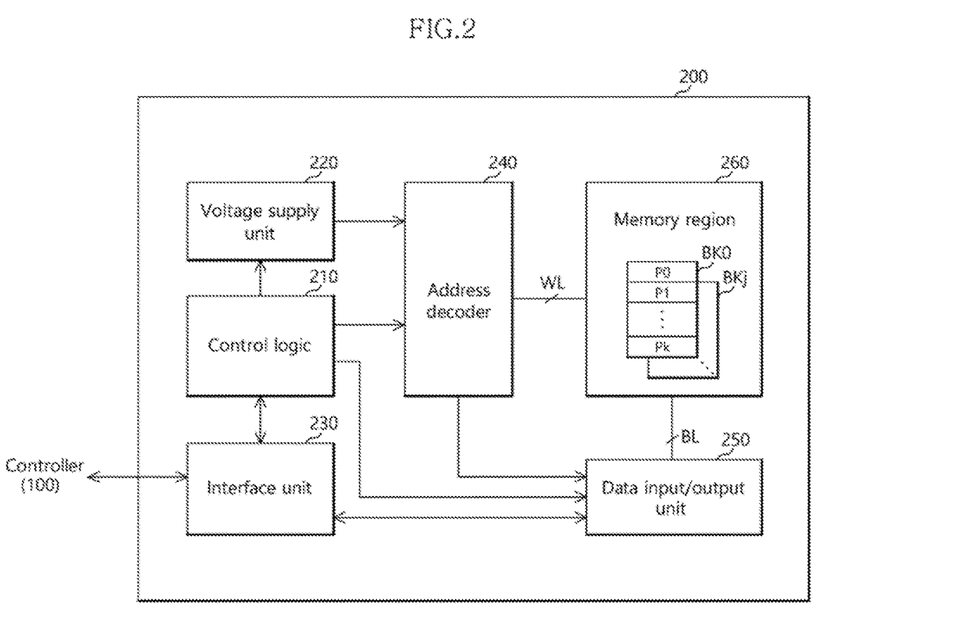
FIG. 2 is a block diagram illustrating a nonvolatile memory device in accordance with an embodiment.

FIG. 2 is a block diagram illustrating a nonvolatile memory device in accordance with an embodiment. For example, the nonvolatile memory device of FIG. 2 may be the nonvolatile memory device 200 shown in FIG. 1.

The nonvolatile memory device 200 may include a control logic 210, a voltage supply unit 220, an interface unit 230, an address decoder 240, a data input/output unit 250, and a memory region 260.

The control logic 210 may control general operations of the nonvolatile memory device 200 according to control of the controller 100. The control logic 210 may receive a command transmitted from the controller 100, from the interface unit 230, and may transmit control signals to internal units of the nonvolatile memory device 200 in response to the command.

The voltage supply unit 220 may generate various operation voltages necessary for general operations of the nonvolatile memory device 200, according to control of the control logic 210. The voltage supply unit 220 may supply, for example, read biases and discrimination biases, to the address decoder 240.

The interface unit 230 may exchange various control signals including commands, addresses and data with the controller 100. The interface unit 230 may transmit various control signals and data inputted thereto, to the internal units of the nonvolatile memory device 200.

The address decoder 240 may decode addresses to select portions to be accessed in the memory region 260. The address decoder 240 may selectively drive word lines WL and control the data input/output unit 250 to selectively drive bit lines BL, according to decoding results.

The data input/output unit 250 may transmit data transmitted from the interface unit 230, to the memory region 260 through the bit lines BL. The data input/output unit 250 may transmit data read from the memory region 260 through the bit lines BL, to the interface unit 230. The data input/output unit 250 may sense that current formed from memory cells included in the memory region 260 are turned on and off in response to read biases, and may acquire data read from the memory cells, according to sensing results.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include memory cell arrays of a two-dimensional or three-dimensional structure.

The memory region 260 may include a plurality of memory blocks BK0 to BKj. Each of the memory blocks BK0 to BKj may include a plurality of pages P0 to Pk.

Figure 3:
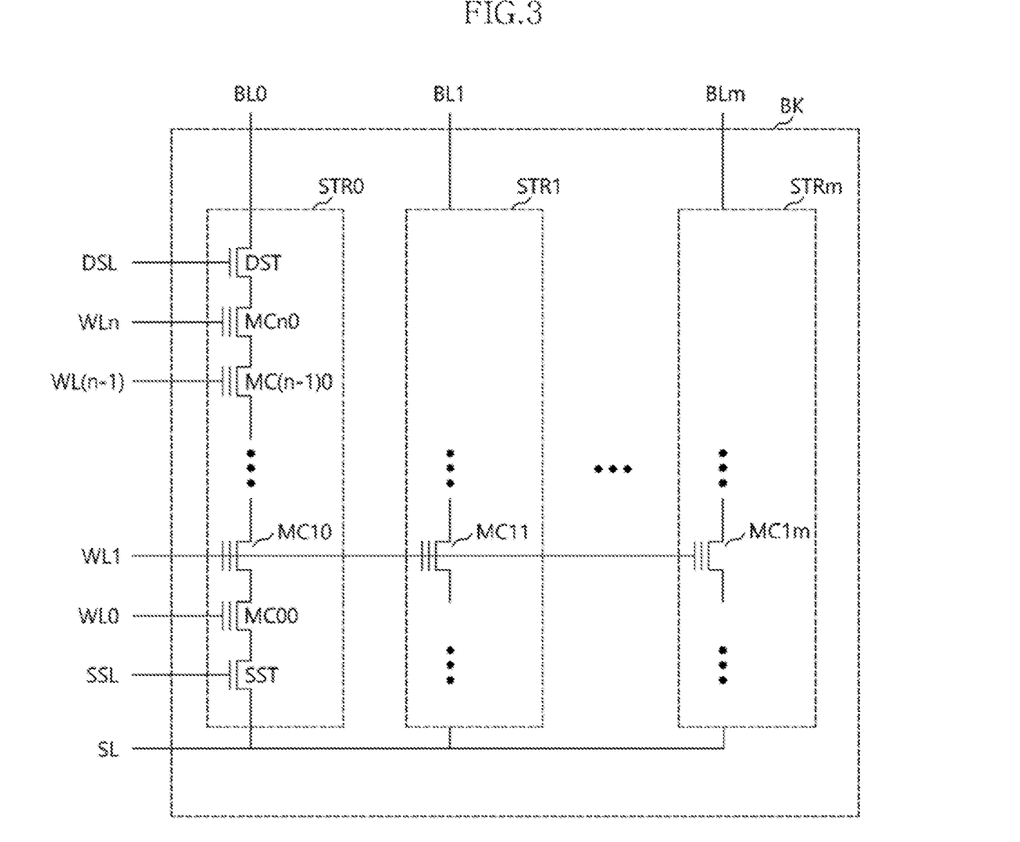
FIG. 3 is a detailed diagram illustrating a memory block.

FIG. 3 is a detailed diagram illustrating a memory block BK. For example, the memory block BK of FIG. 3 may be one of the memory blocks BK0 to BKj shown in FIG. 2. Each of the memory blocks BK0 to BKj shown in FIG. 2 may be configured in substantially the same way as the memory block BK.

Referring to FIG. 3, the memory block BK may include strings STR0 to STRm. Each of the strings STR0 to STRm may be coupled between a source line SL and a corresponding bit line. For example, the string STR0 may be coupled between the source line SL and a bit line BL0.

The strings STR1 to STRm may be configured in substantially the same way as the string STR0, and therefore, the string STR0 will be described as an example. The string STR0 may include a drain select transistor DST, memory cells MC00 to MCn0, and a source select transistor SST. The drain select transistor DST may have a drain which is coupled to the bit line BL0 and a gate which is coupled to a drain select line DSL. The source select transistor SST may have a source which is coupled to the source line SL and a gate which is coupled to a source select line SSL. The memory cells MC00 to MCn0 may be coupled in series between the source select transistor SST and the drain select transistor DST. Gates of the memory cells MC0 to MCn0 may be coupled to word lines WL0 to WLn, respectively.

Each of the word lines WL0 to WLn may be coupled to corresponding memory cells of the strings STR0 to STRm. For example, the word line WL1 may be coupled to memory cells MC10 to MC1m which are included in the strings STR0 to STRm, respectively. Memory cells may be written when corresponding word lines are selected in a write operation. The memory cells MC10 to MC1m may be simultaneously written when the word line WL1 is selected in the write operation.

Each word line or memory cells coupled to each word line may correspond to a plurality of pages according to the number of data bits which are stored in each memory cell. For example, when 3 bits that is, a least significant bit (LSB), a central significant bit (CSB) and a most significant bit (MSB) are stored in each memory cell, each word line may correspond to LSB, CSB and MSB pages in which the LSB, CSB and MSB are respectively stored. A case in which 3 bits are stored in each memory cell will be described below as an example, however, it is to be noted that the embodiment is not limited to such an example.

Figure 4A:
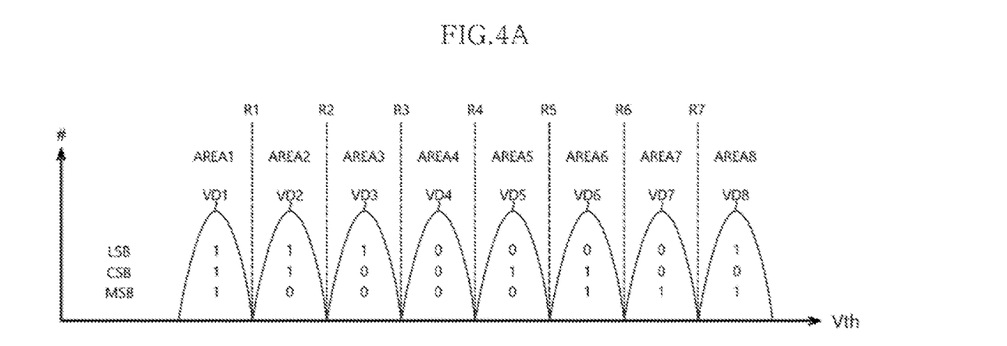
FIG. 4A is a diagram illustrating an example of threshold voltage distributions of memory cells.

FIG. 4A is a diagram illustrating an example of threshold voltage distributions VD1 to VD8 of memory cells. The horizontal axis Vth represents a threshold voltage of a memory cell, and the vertical axis # represents the number of memory cells corresponding to a threshold voltage.

Referring to FIG. 4A, memory cells may form predetermined threshold voltage distributions VD1 to VD8 according to data stored therein. A memory cell may be controlled to have a threshold voltage corresponding to any one among the 8 threshold voltage distributions VD1 to VD8, according to 3-bit data stored therein. For example, a memory cell stored with data "111" may have a threshold voltage corresponding to the threshold voltage distribution VD1.

A memory cell may be turned on or off according to a threshold voltage, when a predetermined read bias is applied through a corresponding word line. Furthermore, a memory cell may be turned on when a read bias greater than its threshold voltage is applied, and may be turned off when a read bias less than its threshold voltage is applied. A threshold voltage distribution corresponding to a memory cell may be determined by sensing current which is formed as the memory cell is turned on or off, and data corresponding to the threshold voltage distribution may be read.

To read data stored in memory cells, read biases R1 to R7 capable of identifying the threshold voltage distributions VD1 to VD8 may be used. The read biases R1 to R7 may delimit areas AREA1 to AREA8 of threshold voltage, and the areas AREA1 to AREA8 may include the threshold voltage distributions VD1 to VD8, respectively.

Since LSB values become different according to threshold voltages of the memory cells when the read biases R3 and R7 are applied to the memory cells, the read biases R3 and R7 may be used to read a data chunk stored in an LSB page. Since CSB values become different according to threshold voltages of the memory cells when the read biases R2, R4 and R6 are applied to the memory cells, the read biases R2, R4 and R6 may be used to read a data chunk stored in a CSB page. Since MSB values become different according to threshold voltages of the memory cells when the read biases R1 and R5 are applied to the memory cells, the read biases R1 and R5 may be used to read a data chunk stored in an MSB page.

Figure 4B:
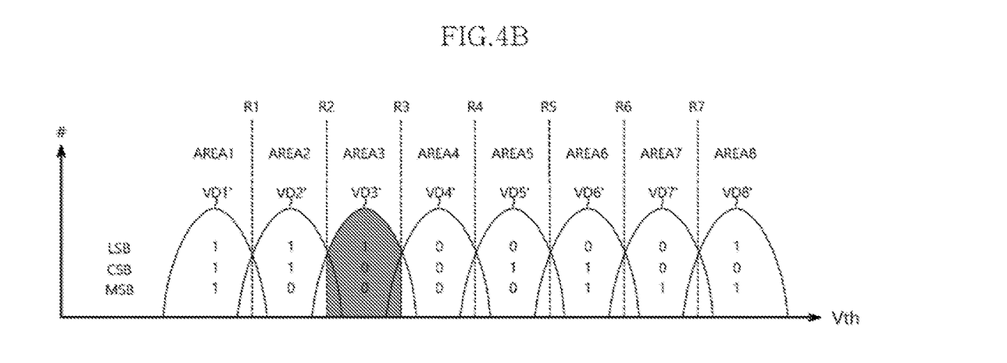
FIG. 4B is a diagram illustrating an example of varied threshold voltage distributions.

FIG. 4B is a diagram illustrating an example of varied threshold voltage distributions VD1' to VD8'.

Referring to FIG. 4B, memory cells may have varied threshold voltages for various reasons such as interference between adjacent memory cells and discharge due to lapse of time. Therefore, the threshold voltage distributions VD1 to VD8 of FIG. 4A may vary to threshold voltage distributions VD1' to VD8', and the read biases R1 to R7 may be positioned on the threshold voltage distributions VD1' to VD8' which overlap with one another. Memory cells corresponding to areas in which the threshold voltage distributions VD1' to VD8' overlap with one another may output error bits. For example, a memory cell which is determined as being positioned in the area AREA3 of threshold voltage based on the read biases R1 to R7, may form the threshold voltage distribution VD3', may also form the threshold voltage distribution VD2' but have a threshold voltage greater than the read bias R2, or may also form the threshold voltage distribution VD4' but have a threshold voltage less than the read bias R3. However, in any case, the memory cell will output data "001." As a result, the memory cell may output data different from data initially stored, in the latter two cases.

According to an embodiment, the controller 100 may estimate optimal read biases for the varied threshold voltage distributions VD1' to VD8'. The optimal read biases may be biases capable of minimizing error bits read from memory cells. The optimal read biases may be positioned in the valleys between the threshold voltage distributions VD1' to VD8'. The controller 100 may use the estimated optimal read biases to read data stored in the memory cells.

Figure 5:
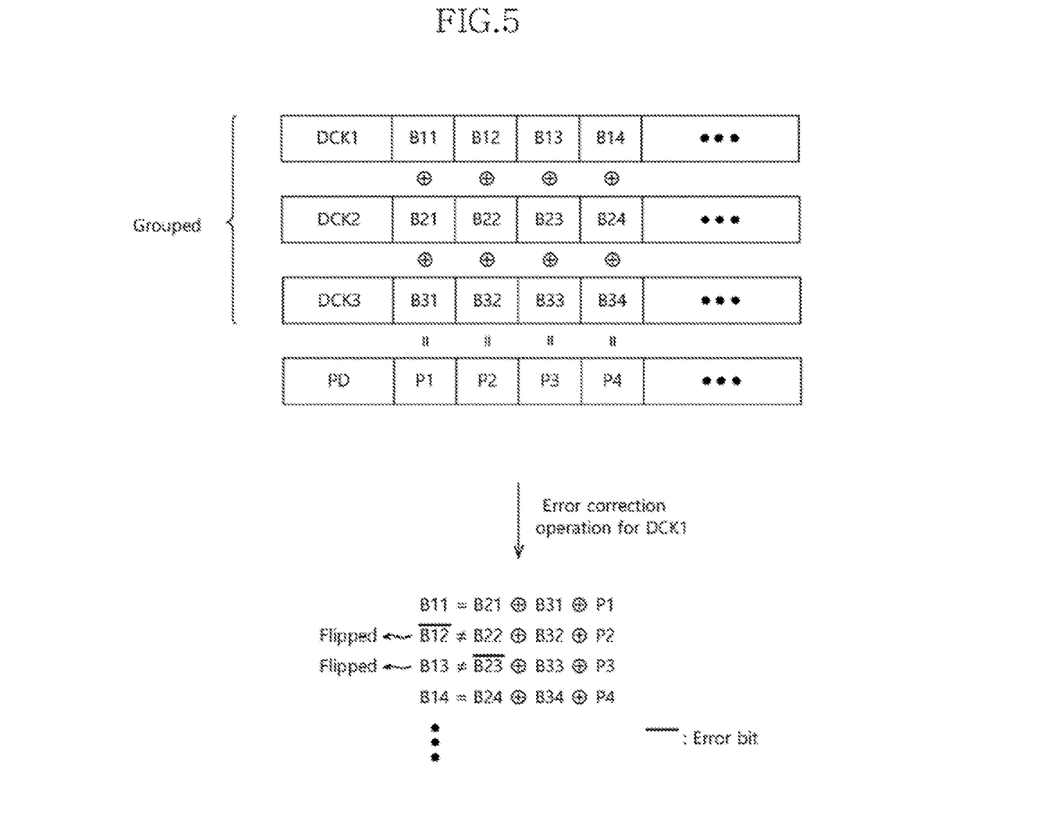
FIG. 5 is a diagram illustrating a method for correcting an error bit by using parity data.

FIG. 5 is a diagram illustrating a method for correcting an error bit by using parity data PD.

Data chunks DCK1, DCK2 and DCK3 may be grouped to generate parity data PD. While FIG. 5 shows that 3 data chunks DCK1, DCK2 and DCK3 are grouped, it is to be noted that the number of data chunks to be grouped is not specifically limited.

The parity data PD may be generated based on the data chunks DCK1, DCK2 and DCK3 which are grouped. For example, the parity data PD may be generated by an XOR logic function on the data chunks DCK1, DCK2 and DCK3. For example, a parity bit P1 may be generated by an XOR logic function on bits B11, B21 and B31 which are grouped from the data chunks DCK1, DCK2 and DCK3, respectively.

The parity data PD may be used to correct an error bit which subsequently occurs in the data chunks DCK1, DCK2 and DCK3. For example, when it is determined that the data chunk DCK1 includes an error bit, an error correction operation may be performed for the data chunk DCK1 based on the remaining data chunks DCK2 and DCK3 grouped together with the data chunk DCK1 and the parity data PD. For example, the bit B11 may match a value that is obtained by performing an XOR logic function on the remaining grouped bits B21 and B31 and the parity bit P1, and accordingly, may be determined as a normal bit. For example, a bit B12 may be different from a value that is obtained by performing an XOR logic function on remaining grouped bits B22 and B32 and a parity bit P2, and accordingly, may be determined as an error bit and be flipped.

Nevertheless, as shown in FIG. 5, when the data chunk DCK2 includes an error bit B23, the error correction operation for the data chunk DCK1 may fail. That is, even though a bit B13 is a normal bit, the bit B13 may be determined as an error bit and be flipped due to an XOR logic function being performed by including the error bit B23. In summary, when each of at least two among grouped data chunks includes an error bit, the above-described error correction operation using the parity data PD may fail.

Figure 6:
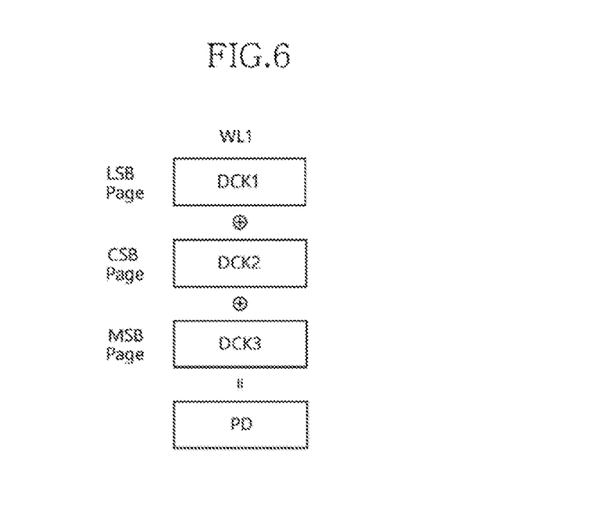
FIGS. 6 and 7 are diagrams illustrating examples of data chunks which are grouped to generate parity data.
Figure 7:
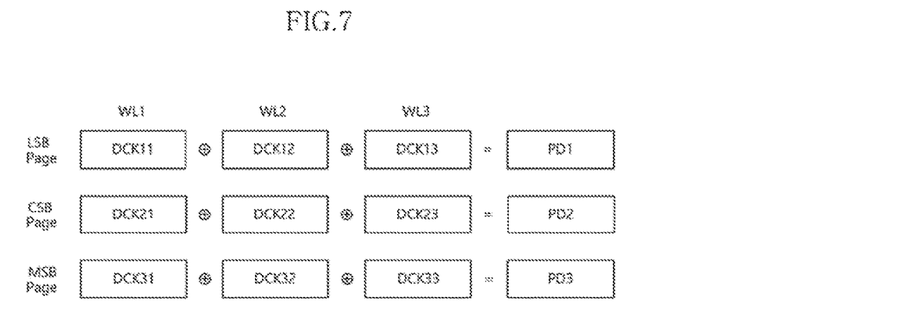

FIGS. 6 and 7 are diagrams illustrating examples of data chunks which are grouped to generate parity data PD.

Referring to FIG. 6, data chunks DCK1, DCK2 and DCK3 stored in LSB, CSB and MSB pages corresponding to a single word line WL1 may be grouped, and parity data PD may be generated for the grouped data chunks DCK1, DCK2 and DCK3.

According to physical and operational characteristics of the nonvolatile memory device 200, data chunks stored in pages corresponding to a single word line are likely to simultaneously include error bits, respectively. For example, when the data chunks DCK1 and DCK2 simultaneously include error bits, respectively, a situation as shown in FIG. 5 may occur. Therefore, when data chunks stored in different pages corresponding to a single word line are grouped, the error correction operation shown in FIG. 5 may have a high probability to fail.

Referring to FIG. 7, data chunks stored in the same kinds of pages in a plurality of word lines WL1 to WL3 may be grouped. For example, data chunks DCK11, DCK12 and DCK13 stored in LSB pages of the word lines WL1 to WL3 may be grouped, and parity data PD1 may be generated for the grouped data chunks DCK11, DCK12 and DCK13.

In this case, parity data are generated by at least the number of types of pages, and accordingly, an overhead may exist in managing the parity data. Moreover, even in the grouping scheme of FIG. 7, the possibility of respective data chunks grouped together to simultaneously include error bits still exists, and accordingly, the error correction operation shown in FIG. 5 may still be imperfect.

Since the error correction operation shown in FIG. 5 is started in a state in which it is impossible to know which bit in the data chunk DCK1 is an error bit, a fundamental problem is that a determination of whether or not a bit is an error bit should be performed for all bits of the data chunk DCK1. That is, despite that bit B13 is a normal bit, since the error correction operation is performed by using the error bit B23, a new error bit occurs.

As will be described below, according to the embodiment, an unreliable bit may be first determined in the data chunk DCK1. Then, whether or not the determined unreliable bit is an error bit, may be determined. For example, the normal bit B13 may not be determined as an unreliable bit, and accordingly, the error correction operation for the normal bit B13 by using the error bit B23 may be blocked in advance. In particular, as shown in FIG. 6, when the data chunks DCK1, DCK2 and DCK3 are stored in different pages corresponding to the same word line, the normal bit B13 may not be determined as an unreliable bit. Therefore, even though data chunks are grouped as shown in FIG. 6, the error correction operation may succeed.

Figure 8:
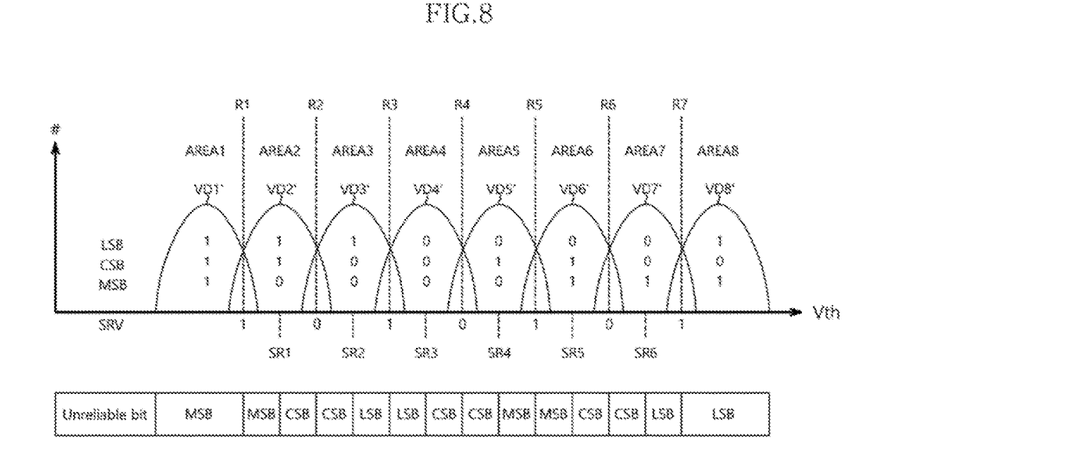
FIG. 8 is a diagram illustrating a method for determining an unreliable bit among bits stored in a memory cell.

FIG. 8 is a diagram illustrating a method for determining an unreliable bit among bits stored in a memory cell, according to the embodiment.

First, data chunks stored in LSB, CSB and MSB pages corresponding to a single word line are read, and discrimination data of corresponding memory cells may be obtained.

The data chunks stored in the LSB, CSB and MSB pages may be read as read biases R1 to R7 are applied to the memory cells. The read biases R1 to R7 may delimit areas AREA1 to AREA8 of threshold voltage of the memory cells. If the data chunks stored in the LSB, CSB and MSB pages are read, bits stored in each of the memory cells may be obtained, and an area in which each of the memory cells is positioned may be determined among the areas AREA1 to AREA8.

The discrimination data may be obtained based on discrimination biases SR1 to SR6. The discrimination data may be data read from the memory cells as the discrimination biases SR1 to SR6 are applied to the memory cells. The discrimination data may include discrimination values SRV corresponding to the respective memory cells. FIG. 8 exemplarily shows discrimination values SRV of "1" or "0" for the discrimination biases SR1 to SR6. For example, a memory cell having a threshold voltage less than the discrimination bias SR1 may correspond to the discrimination value SRV "1," and a memory cell having a threshold voltage between the discrimination biases SR1 and SR2 may correspond to the discrimination value SRV "0". A memory cell having a threshold voltage between the discrimination biases SR2 and SR3 may correspond to the discrimination value SRV "1". A memory cell having a threshold voltage between the discrimination biases SR3 and SR4 may correspond to the discrimination value SRV "0". A memory cell having a threshold voltage between the discrimination biases SR4 and SR5 may correspond to the discrimination value SRV "1". A memory cell having a threshold voltage between the discrimination biases SR5 and SR6 may correspond to the discrimination value SRV "0". A memory cell having a threshold voltage greater than the discrimination bias SR6 may correspond to the discrimination value SRV "1". The discrimination biases SR1 to SR6 may subdivide the areas AREA1 to AREA8 of threshold voltage.

An unreliable bit may be determined among bits stored in each of the memory cells, based on data chunks and discrimination data. For example, in a memory cell corresponding to data "011" and a discrimination value SRV "1," an unreliable bit may be an MSB. In a memory cell corresponding to data "011" and a discrimination value SRV "0," an unreliable bit may be a CSB. In a memory cell corresponding to data "001" and a discrimination value SRV "0," an unreliable bit may be a CSB. In a memory cell corresponding to data "001" and a discrimination value SRV "1," an unreliable bit may be a LSB. In a memory cell corresponding to data "000" and a discrimination value SRV "1," an unreliable bit may be a LSB. In a memory cell corresponding to data "100" and a discrimination value SRV "1," an unreliable bit may be a LSB. In a memory cell corresponding to data "101" and a discrimination value SRV "1," an unreliable bit may be a LSB. A principle for determining an unreliable bit will be described below in detail with reference to FIGS. 9A and 9B.

Figure 9A:
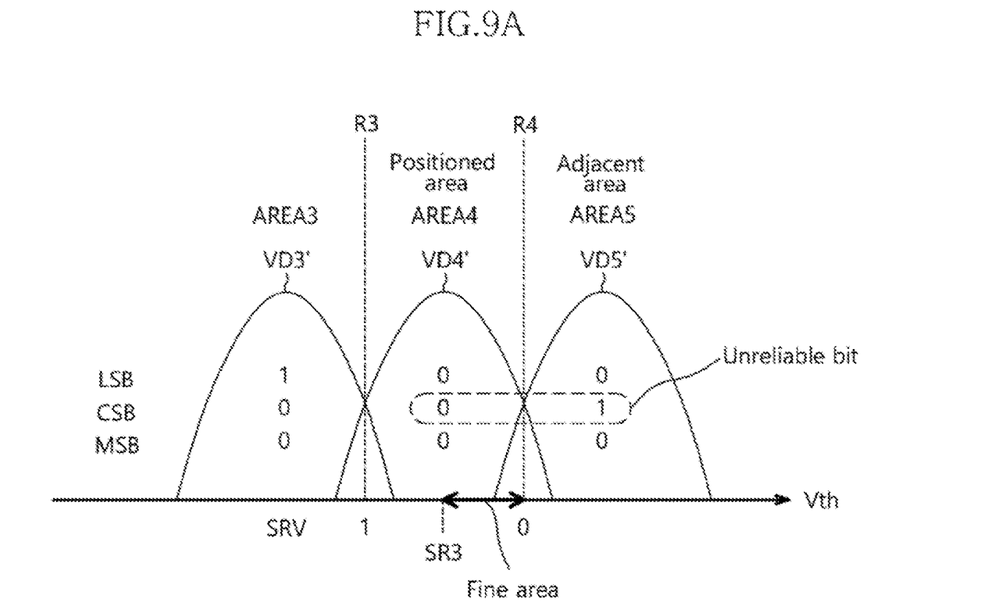
FIGS. 9A and 9B are diagrams illustrating a method for determining an unreliable bit according to a subdivided area in which a memory cell is positioned.
Figure 9B:
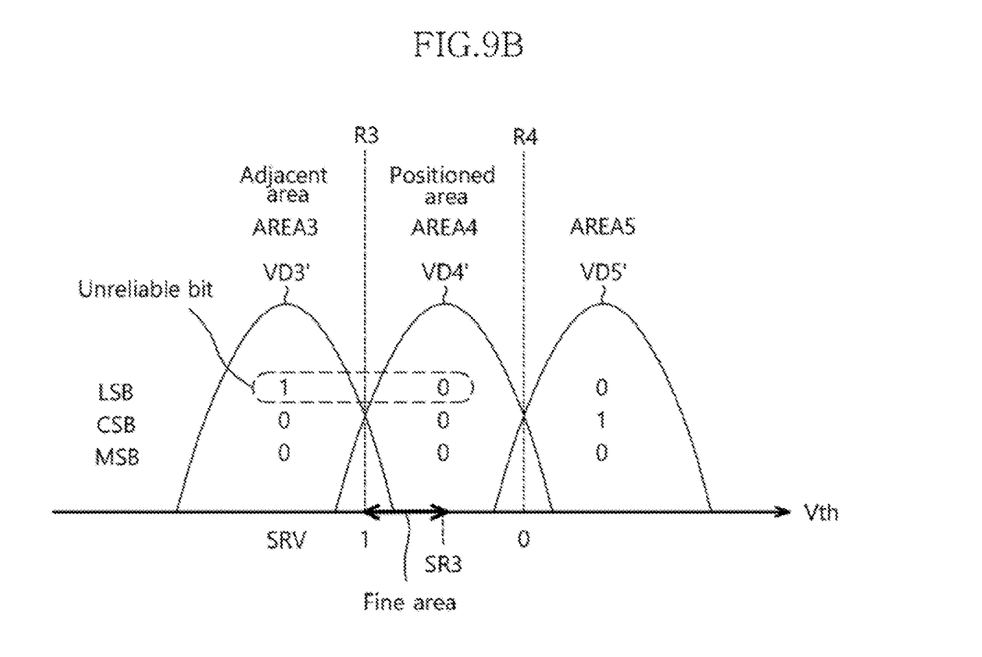

FIGS. 9A and 9B are diagrams illustrating a method for determining an unreliable bit according to a subdivided area in which a memory cell is positioned.

Referring to FIG. 9A, first, data "000" stored in a memory cell may be read by applying the read biases R1 to R8 to the memory cell, and it may be determined that the memory cell is positioned in the area AREA4. In this case, it may be estimated that the memory cell forms the threshold voltage distribution VD4', forms the threshold voltage distribution VD3' but has a threshold voltage greater than the read bias R3, or forms the threshold voltage distribution VD5' but has a threshold voltage less than the read bias R4.

When the memory cell has a threshold voltage greater than the discrimination bias SR3, a discrimination value SRV "0" of the memory cell may be additionally obtained. Accordingly, it may be determined that the memory cell is positioned in the subdivided area or fine area, shown in the drawing. That is, it may be determined based on the discrimination value SRV "0" that the memory cell is positioned closer to the area AREA5 than the area AREA3.

Therefore, it may be determined that the memory cell is highly likely to form the threshold voltage distribution VD4' or the threshold voltage distribution VD5' rather than forming the threshold voltage distribution VD3'. In this case, among the plurality of bits "000" stored in the memory cell, bits which match corresponding bits of an adjacent data pattern "010" corresponding to the adjacent area AREA5 that is, the LSB "0" and the MSB "0" may be reliable bits since they have the same values regardless of whether the memory cell forms the threshold voltage distribution VD4' or the threshold voltage distribution VD5'. However, among the plurality of bits "000" stored in the memory cell, a bit which does not match a corresponding bit of the adjacent data pattern "010" that is, the CSB "0" may be determined as being unreliable. Furthermore, the CSB "0" read from the memory cell may be a normal bit when the memory cell forms the threshold voltage distribution VD4' and may be an error bit when the memory cell forms the threshold voltage distribution VD5'.

Based on the above-described principle, referring again to FIG. 8, it may be checked that, when a memory cell positioned in the area AREA4 corresponds to the discrimination value SRV "0," an unreliable bit is the CSB.

Referring to FIG. 9B, unlike FIG. 9A, when the memory cell has a threshold voltage less than the discrimination bias SR3, a discrimination value SRV "1" of the memory cell may be obtained. Based on the discrimination value SRV "1," it may be determined that the memory cell is positioned in the subdivided area or fine area shown in the drawing. Therefore, it may be determined that the memory cell is highly likely to form the threshold voltage distribution VD3' or the threshold voltage distribution VD4'.

In this case, among the plurality of bits "000" stored in the memory cell, bits which match corresponding bits of an adjacent data pattern "001" corresponding to the adjacent area AREA3 that is, the CSB "0" and the MSB "0" may be reliable bits since they have the same values regardless of whether the memory cell forms the threshold voltage distribution VD3' or the threshold voltage distribution VD4'. However, among the plurality of bits "000" stored in the memory cell, a bit which does not match a corresponding bit of the adjacent data pattern "001" that is, the LSB "0" may be determined as being unreliable.

As described above with reference to FIGS. 8 to 9B, when a memory cell is positioned in a subdivided area between a left subdivided area and a right subdivided area, based on a discrimination bias in a corresponding threshold voltage area, an unreliable bit may be determined. That is, a subdivided area in which a memory cell is positioned and a type of an unreliable bit, that is an LSB, a CSB or an MSB, may correspond to each other. Therefore, a subdivided area in which a memory cell is positioned may be specified according to whether an unreliable bit is an LSB, a CSB or an MSB. As a consequence, as will be described below, an unreliable area may be defined according to a type of a page, that is, an LSB page, a CSB page or an MSB page.

Figure 10A:
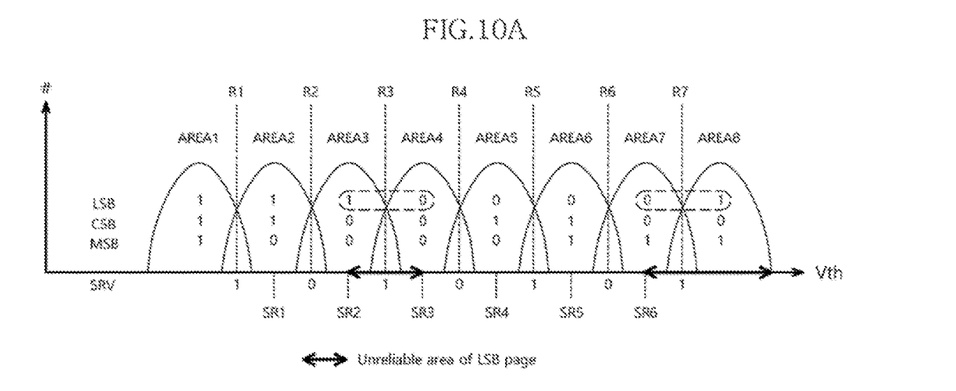
FIGS. 10A to 10C are diagrams illustrating a method for determining unreliable bits in data chunks, based on unreliable areas according to types of pages.
Figure 10B:
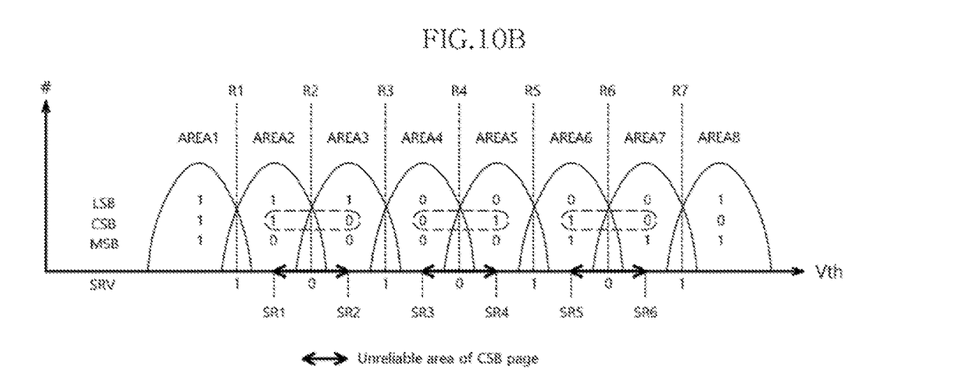
Figure 10C:
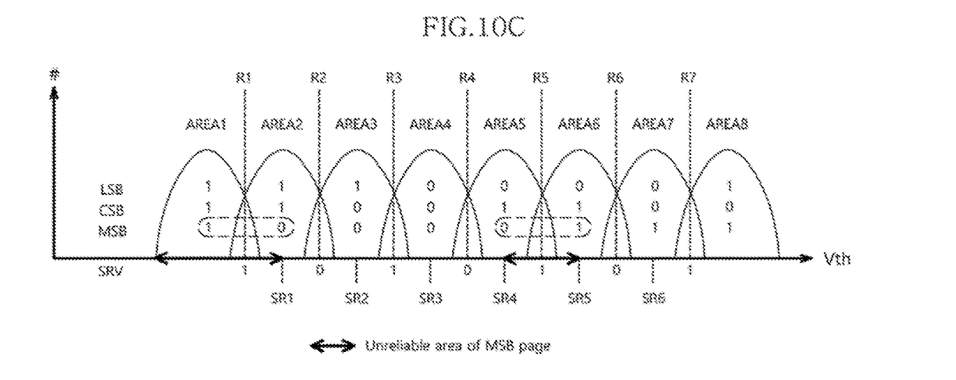

FIGS. 10A to 10C are diagrams illustrating a method for determining unreliable bits in data chunks, based on unreliable areas according to types of pages. FIGS. 10A to 10C respectively show unreliable areas of LSB, CSB and MSB pages.

Referring to FIG. 10A, in an LSB data chunk, bits read from memory cells corresponding to unreliable areas shown in the drawing may be determined as unreliable bits. The unreliable areas may include a predetermined range limited by adjacent discrimination biases, based on the read biases R3 and R7 for reading the LSB data chunk. For example, the unreliable areas may include the predetermined range limited by the discrimination biases SR2 and SR3 based on the read bias R3, and may include the predetermined range limited by the discrimination bias SR6 based on the read bias R7.

Referring to FIG. 10B, in a CSB data chunk, bits read from memory cells corresponding to unreliable areas shown in the drawing may be determined as unreliable bits. The unreliable areas may include a predetermined range limited by adjacent discrimination biases, based on the read biases R2, R4 and R6 for reading the CSB data chunk. For example, the unreliable areas may include the predetermined range limited by the discrimination biases SR1 and SR2 based on the read bias R2, may include the predetermined range limited by the discrimination biases SR3 and SR4 based on the read bias R4, and may include the predetermined range limited by the discrimination biases SR5 and SR6 based on the read bias R6.

Referring to FIG. 10C, in an MSB data chunk, bits read from memory cells corresponding to unreliable areas shown in the drawing may be determined as unreliable bits. The unreliable areas may include a predetermined range limited by adjacent discrimination biases, based on the read biases R1 and R5 for reading the MSB data chunk. For example, the unreliable areas may include the predetermined range limited by the discrimination bias SR1 based on the read bias R1, and may include the predetermined range limited by the discrimination biases SR4 and SR5 based on the read bias R5.

Summarizing these, according to the embodiment, based on a plurality of bits read from a memory cell and a discrimination value of the memory cell, a subdivided area corresponding to the memory cell may be determined, and which bit among the plurality of bits is an unreliable bit may be determined. That is, determination of which bit is an unreliable bit in a data chunk read from a page may be performed by determining whether a corresponding memory cell corresponds to an unreliable area specified according to a type of the page.

If an unreliable bit is determined in a data chunk, whether the unreliable bit is an error bit may be determined based on the remaining bits grouped together and generation of a parity bit. That is, the unreliable bit may be determined as a normal bit when a value obtained by performing an XOR logic function on the remaining grouped bits and the parity bit matches the unreliable bit, and may be determined as an error bit when the value does not match the unreliable bit.

Referring again to FIG. 5, since it is impossible to precisely determine which bit in the data chunk DCK1 is an error bit, the error correction operation for the normal bit B13 is performed by using the error bit B23, whereby a new error bit occurs. However, according to the embodiment, if the data chunks DCK1 to DCK3 are stored in different pages of the same word line, the normal bit B13 may not be determined as an unreliable bit. The reason is that, as described above with reference to FIGS. 9A and 9B, since only one among a plurality of bits stored in a memory cell is determined as an unreliable bit, only the error bit B23 will be determined as an unreliable bit. Accordingly, the normal bit B13 is not determined as an unreliable bit, and the error correction operation for the normal bit B13 may not be performed.

Figure 11:
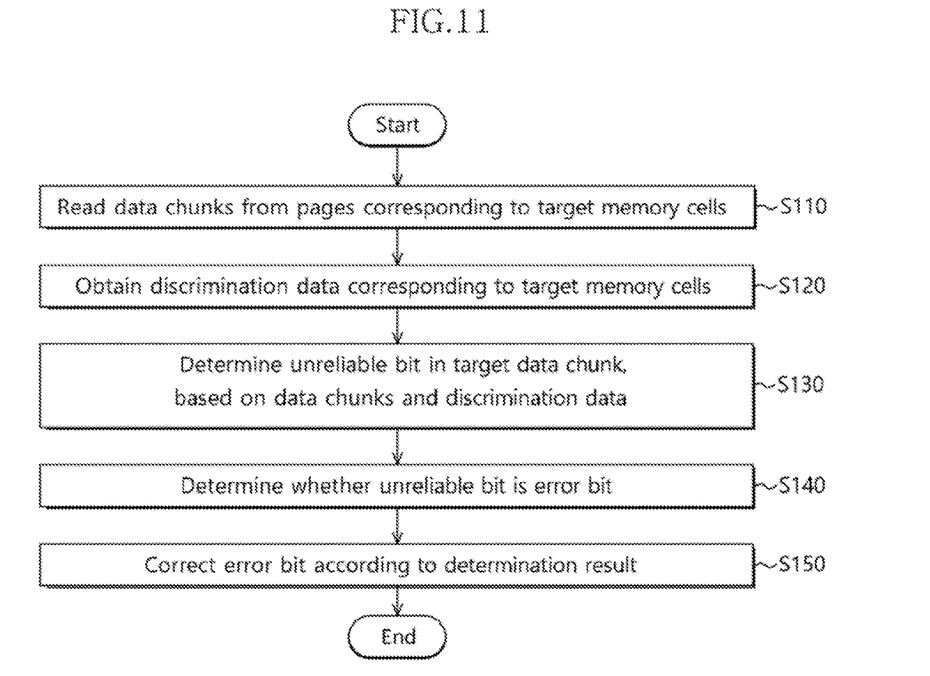
FIG. 11 is a flow chart illustrating a method for operating a data storage device in accordance with an embodiment.

FIG. 11 is a flow chart illustrating a method for operating a data storage device in accordance with an embodiment. For example, the method of FIG. 11 may be a method for operating the data storage device 10 of FIG. 1. Referring to FIG. 11, there is shown a method for the controller 100 to perform an error correction operation for a target data chunk read from target memory cells of the nonvolatile memory device 200.

At step S110, the controller 100 may read a plurality of data chunks from a plurality of pages corresponding to target memory cells, based on read biases.

At step S120, the controller 100 may obtain discrimination data corresponding to the target memory cells, based on discrimination biases. The discrimination biases may be respectively positioned between the read biases, in such a way as to be alternate with the read biases.

At step S130, the controller 100 may determine an unreliable bit in a target data chunk, based on the plurality of data chunks and the discrimination data. When the read biases delimit areas of threshold voltage of memory cells and the areas correspond to data patterns, the unreliable bit may be a bit in a data pattern corresponding to a plurality of bits read from a target memory cell, which does not match a corresponding bit in an adjacent data pattern. The unreliable bit may be a bit which is read from a target memory cell corresponding to an unreliable area among the areas of threshold voltage. The unreliable area may include a predetermined range limited by adjacent discrimination biases, based on a read bias which is used to read the target data chunk.

At step S140, the controller 100 may determine whether the unreliable bit is an error bit. In detail, the controller 100 may obtain data chunks grouped together with the target data chunk and parity data, and may determine whether the unreliable bit is an error bit, based on the grouped data chunks and the parity data.

At step S150, the controller 100 may correct the error bit according to a determination result.

Figure 12:
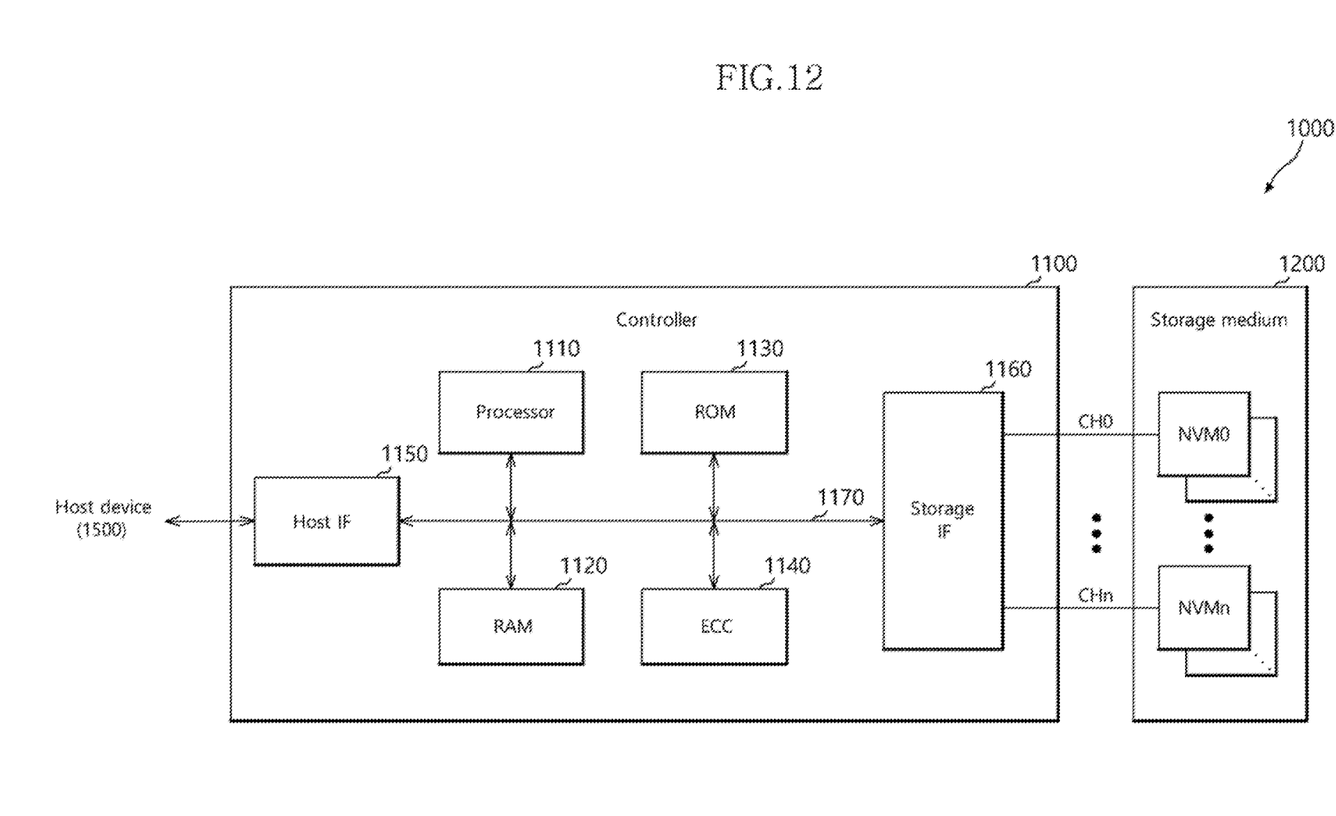
FIG. 12 is a block diagram illustrating a solid state drive (SSD) in accordance with an embodiment.

FIG. 12 is a block diagram illustrating a solid state drive (SSD) 1000 in accordance with an embodiment.

The SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface 1150, and a storage medium interface 1160.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

Additionally, the processor 1110 may operate in a manner substantially similar to the processor 110 shown in FIG. 1. The processor 1110 may read a plurality of data chunks from a plurality of pages corresponding to target memory cells based on read biases, may obtain discrimination data corresponding to the target memory cells based on discrimination biases, and may determine an unreliable bit in a target data chunk based on the plurality of data chunks and the discrimination data. The processor 1110 may obtain data chunks grouped together with the target data chunk and parity data, and may determine whether the unreliable bit is an error bit, based on the grouped data chunks and the parity data.

The RAM 1120 may store programs and program data to be used by the processor 1110. The RAM 1120 may temporarily store data transmitted from the host interface 1150 before transferring it to the storage medium 1200, and may temporarily store data transmitted from the storage medium 1200 before transferring it to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error which occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may include data transmitted from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and a read operation according to control of the controller 1100.

Figure 13:
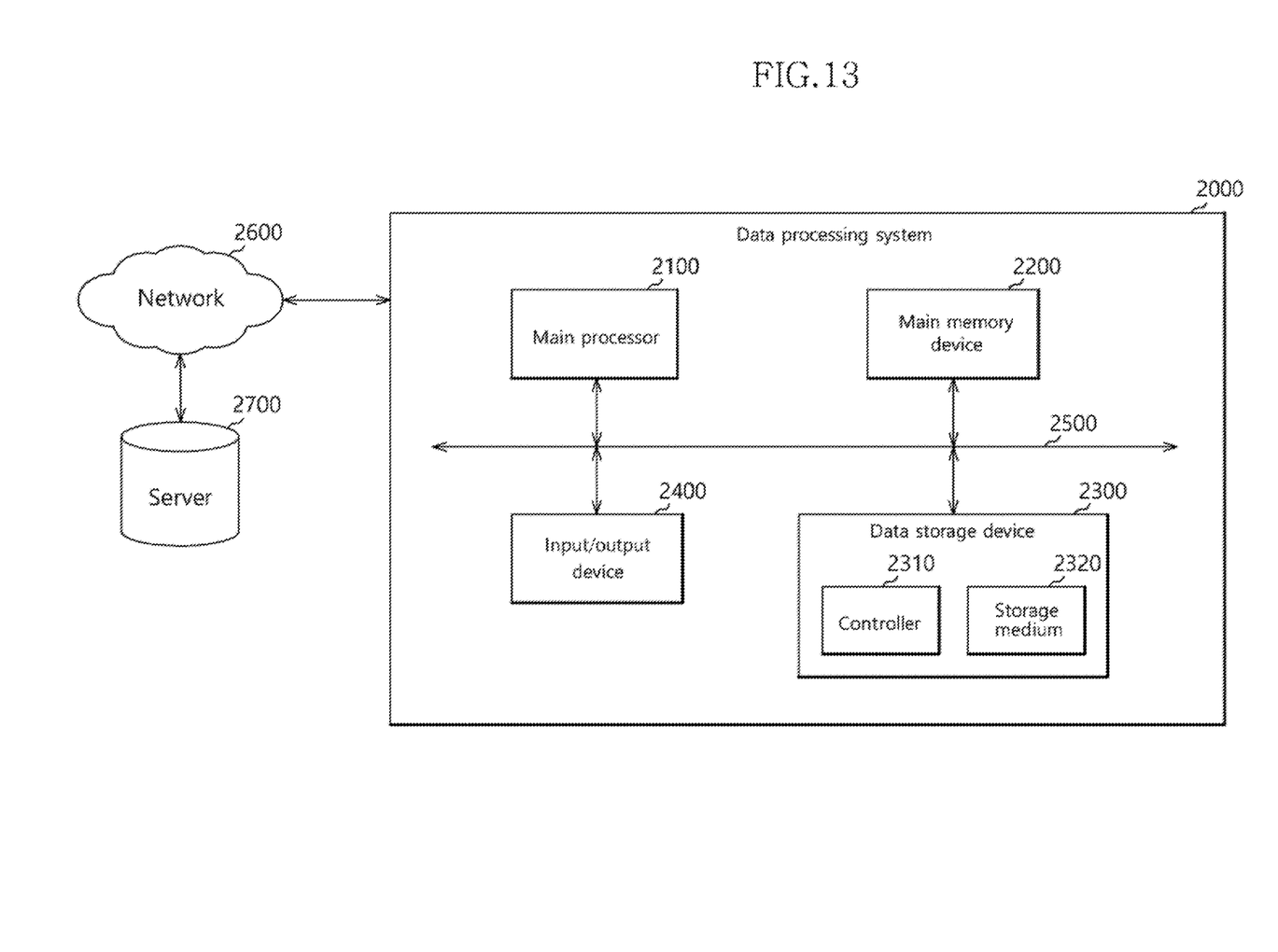
FIG. 13 is a block diagram illustrating a data processing system to which the data storage device in accordance with the embodiment is applied.

FIG. 13 is a block diagram illustrating a data processing system 2000 in which the data storage device 10 in accordance with the embodiment is applied.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured to operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments.

What is claimed is:

1. A method for operating a data storage device, the method comprising:
   reading, by a controller, a plurality of data chunks from a plurality of pages corresponding to target memory cells coupled to a target word line based on read biases so that the read biases minimize error bits read from the target memory cell;
   obtaining, by the controller, discrimination values corresponding to the target memory cells based on discrimination biases;
   determining, by the controller, an unreliable bit in a target data chunk among the plurality of data chunks based on the plurality of data chunks and the discrimination values;
   determining, by the controller, whether the unreliable bit is an error bit; and
   performing an error correction operation for the target data chunk by flipping the error bit,
   wherein the read biases and the discrimination biases are alternately positioned one by one,
   wherein the discrimination biases delimit areas of threshold voltage of the target memory cells, each area corresponding to a discrimination bit, and
   wherein the obtaining of the discrimination values corresponding to the target memory cells includes:
      applying, by a nonvolatile memory device, the discrimination biases to the target word line of a target memory cell,
      determining, by the nonvolatile memory device, an area of threshold voltage in which the target memory cell is positioned, based on a response of the target memory cell to the discrimination biases depending on a threshold voltage of the target memory cell; and
      outputting, by the nonvolatile memory device, a discrimination bit corresponding to the area of threshold voltage to the controller, as a discrimination value corresponding to the target memory cell.

2. The method according to claim 1, wherein the unreliable bit is read from a memory cell corresponding to an unreliable area among the areas of threshold voltage.

3. The method according to claim 2, wherein the unreliable area includes a predetermined range determined by discrimination bias adjacent to a read bias which is used to read the target data chunk.

4. The method according to claim 1, wherein the determining of whether the unreliable bit is the error bit comprises:
   obtaining data chunks grouped with the target data chunk and parity data; and
   determining whether the unreliable bit is the error bit based on the grouped data chunks and the parity data.

5. The method according to claim 4, wherein at least one of the grouped data chunks is included in the plurality of data chunks.

6. A data storage device comprising:
   a nonvolatile memory device including target memory cells which are coupled to a target word line and correspond to a plurality of pages; and
   a controller suitable for:
      reading a plurality of data chunks from the plurality of pages based on read biases so that the read biases minimize error bits read from the target memory cell;
      obtaining discrimination values corresponding to the target memory cells based on discrimination biases;
      determining an unreliable bit in a target data chunk among the plurality of data chunks based on the plurality of data chunks and the discrimination values;
      determining whether the unreliable bit is an error bit; and
      performing an error correction operation for the target data chunk by flipping the error bit,
   wherein the read biases and the discrimination biases are alternately positioned one by one,
   wherein the discrimination biases delimit areas of threshold voltage of the target memory cells, each area corresponding to a discrimination bit,
   wherein the nonvolatile memory device applies the discrimination biases to the target word line of a target memory cell, determines an area of threshold voltage in which the target memory cell is positioned, based on a response of the target memory cell to the discrimination biases depending on a threshold voltage of the target memory cell, and outputs a discrimination bit corresponding to the area of threshold voltage to the controller, as a discrimination value corresponding to the target memory cell.

7. The data storage device according to claim 6, wherein the unreliable bit is read from a memory cell corresponding to an unreliable area among the areas of threshold voltage.

8. The data storage device according to claim 7, wherein the unreliable area includes a predetermined range determined by discrimination bias adjacent to a read bias which is used to read the target data chunk.

9. The data storage device according to claim 6, wherein the controller obtains data chunks grouped with the target data chunk and parity data, and determines whether the unreliable bit is the error bit, based on the grouped data chunks and the parity data.

10. The data storage device according to claim 9, wherein at least one of the grouped data chunks is included in the plurality of data chunks.

11. A method for operating a data storage device, the method comprising:
   reading, by a controller, data including multiple bits from a target memory cell among a plurality of memory cells by applying at least one read bias selected from among a plurality of read biases corresponding to a plurality of threshold voltage areas so that the at least one read bias minimizes error bits read from the target memory cell;

determining, by the controller, an unreliable bit among the multiple bits; and determining, by the controller, whether the unreliable bit is an error bit, wherein determining of the unreliable bit among the multiple bits comprises:

comparing, by the controller, the multiple bits with bits included in another data corresponding to at least one adjacent area, which is adjacent to a certain area corresponding to the one read bias, among the plurality of threshold voltage areas; and determining, by the controller, the unreliable bit based on the comparison result between the multiple bits and the bits included in the another data, wherein the plurality of read biases delimit the threshold voltage areas of the plurality of memory cells.

12. The method of claim 11, wherein determining of the unreliable bit based on the comparison result comprises:

determining each of the multiple bits which are different from each of the bits included in the another data as the unreliable bit.

13. The method of claim 11, wherein determining of the unreliable bit among the multiple bits comprises:

determining the another data corresponding to the at least one adjacent area based on one discrimination bias corresponding to the certain area, among multiple discrimination biases.

14. The method of claim 13, wherein each of the discrimination biases is positioned between two adjacent read biases among the plurality of read biases.

15. The method of claim 11, wherein determining whether the unreliable bit is the error bit comprises:

obtaining remaining bits grouped with the unreliable bit to generate a parity bit; and determining whether the unreliable bit is the error bit based on the remaining bits and the parity bit.

16. The method of claim 11, further comprising:

if it is determined that the unreliable bit is the error bit, performing an error correction operation for the unreliable bit.

* * * * *